(12) United States Patent
Daubenspeck et al.

(10) Patent No.: US 7,411,135 B2
(45) Date of Patent: Aug. 12, 2008

(54) CONTOUR STRUCTURES TO HIGHLIGHT INSPECTION REGIONS

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 394 days.

(21) Appl. No.: 10/711,885

(22) Filed: Oct. 12, 2004

(65) Prior Publication Data

US 2006/0076159 A1    Apr. 13, 2006

(51) Int. Cl.
*H01R 12/04*    (2006.01)

(52) U.S. Cl. ................. 174/261; 257/525; 257/786

(58) Field of Classification Search ............. 361/261, 361/820; 174/254, 255
See application file for complete search history.

(56) References Cited

U.S. PATENT DOCUMENTS

| | | | |
|---|---|---|---|
| 5,053,357 A | 10/1991 | Lin et al. | |
| 5,053,850 A | 10/1991 | Baker et al. | |
| 5,153,507 A | 10/1992 | Fong et al. | |
| 5,831,836 A * | 11/1998 | Long et al. | 361/820 |
| 5,886,414 A | 3/1999 | Galloway | |
| 5,900,643 A | 5/1999 | Preslar et al. | |
| 6,011,299 A * | 1/2000 | Brench | 257/660 |
| 6,083,822 A * | 7/2000 | Lee | 438/624 |
| 6,093,630 A * | 7/2000 | Geffken et al. | 438/612 |
| 6,297,561 B1 | 10/2001 | Liu et al. | |
| 6,605,526 B1 * | 8/2003 | Howell et al. | 438/618 |
| 6,713,881 B2 | 3/2004 | Umehara et al. | |
| 2003/0197289 A1 | 10/2003 | Lin | |

FOREIGN PATENT DOCUMENTS

JP    2001338955 A    9/2002

* cited by examiner

*Primary Examiner*—Jeremy C. Norris
*Assistant Examiner*—Abiy Getachew
(74) *Attorney, Agent, or Firm*—Gibb & Rahman, LLC

(57) ABSTRACT

An integrated circuit has a wiring layer below an insulator layer. A pad comprises a conductive material that is on the insulator layer. The pad has a wirebond connection region and a probe pad region. An inspection mark is between the wirebond connection region and the probe pad region. The inspection mark comprises an opening in the insulator layer that is filled with the conductive material. In addition, a contact that is through the insulator layer is adapted to electrically connect the conductor wire in the wiring layer to the pad. The contact is formed of the same conductive material used for the pad and the inspection mark.

18 Claims, 7 Drawing Sheets

CONTOUR STRUCTURES TO HIGHLIGHT INSPECTION REGIONS

BACKGROUND OF THE INVENTION

1. Field of the Invention

The invention generally relates to inspection marks for probe contacts adjacent wirebond connections, where the inspection marks comprise marks in the same conductor that is used as the probe pad and the wirebond connection.

2. Description of the Related Art

Wirebond connections are commonly used on the exterior layer of integrated circuits and chips to connect the circuitry within the chips to external devices and wiring boards. A wirebond connection comprises a conductive wire from an external device that is bonded to a conductive connection on the wafer or chip. It is common to form conductive probe contacts to which test probes and other similar devices make temporary contact when testing the chip. These probe contacts are formed next to the wirebond connection and are electrically connected to the wirebond connection.

Wirebond connections are being made with finer and finer pitch (e.g., are being made smaller and closer together). However, even as wirebond connections are being placed closer together, the probe contact (where the wafer tester touches down on the wafer) needs to be offset from the wirebond location in order to allow a good wirebond connection that has high yield and reliability. Failure to provide sufficient pristine pad surface area for the probe contact has shown to lead to yield and reliability failures. A visual inspection is typically performed by operators and a subjective decision is made as to whether the wirebond location has been damaged by the probe contact. Without a clearly marked inspection region, it is difficult to clearly determine whether the probe produced damage is outside the area in which the wirebond will be formed.

SUMMARY OF THE INVENTION

Presented below is a method of creating inspection marks for probe contacts adjacent wirebond connections. More specifically, this method creates an inspection mark between a wirebond connection region and a probe pad region of a pad. The method first forms an insulator layer over a wiring layer and then simultaneously patterns a wiring contact opening and an inspection mark opening in the insulator layer. The method then deposits a conductor material over the insulator layer. The conductor material fills the wiring contact opening and the inspection mark opening and forms the pad on the insulator layer. The conductor material within the inspection mark opening forms the inspection mark that is between the wirebond connection region and the probe pad region. Following this, the invention forms a polyimide layer above the conductive material and forms a second opening in the polyimide layer. The pad is exposed through this second opening.

The inspection mark opening is formed above an insulating region of the wiring layer. The conductor material comprises a refractive metal, such as aluminum, tantalum, titanium, and alloys thereof. The inspection mark delineates where probe inspection marks are permitted on the pad.

The structure produced is an integrated circuit that has a wiring layer below the insulator layer. The pad comprises the conductive material that is on the insulator layer. The pad has a wirebond connection region and a probe pad region. The inspection mark is between the wirebond connection region and the probe pad region. The inspection mark comprises an opening in the insulator layer that is filled with the conductive material. In addition, the contact that is through the insulator layer is adapted to electrically connect the conductor wire in the wiring layer to the pad and the contact is formed of the same conductive material used for the pad and the inspection mark.

Thus, the invention creates "inspection regions" by creating a 3-dimensional topography on the Al bond pad. One advantage of this invention is that it can be implemented and inspected independently of the final aestivation process or the material used in the final aestivation process. Therefore, the invention can be used, for example, with polyimide materials that do not provide easy inspection markings.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
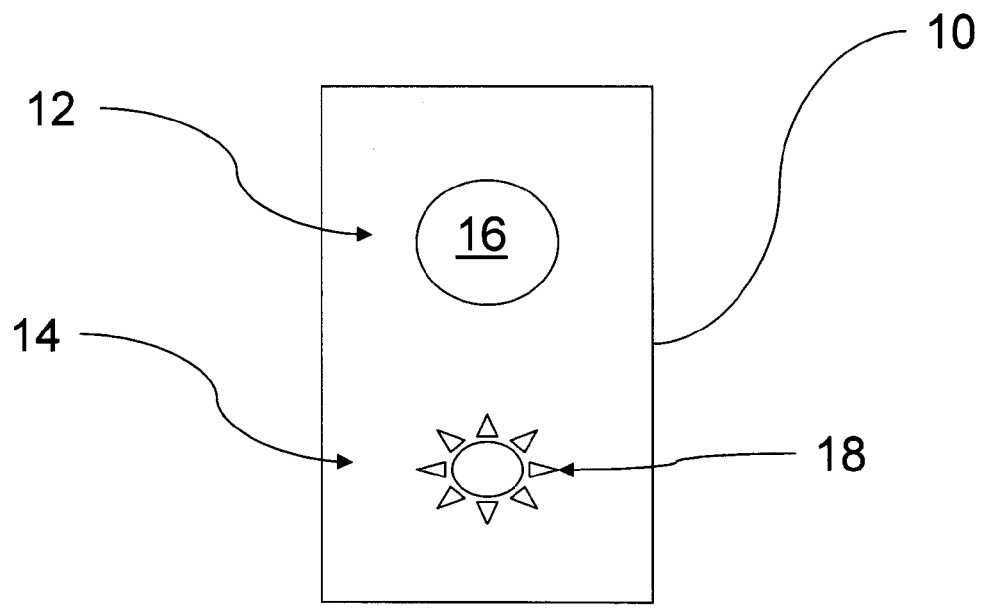
FIG. 1 is a schematic top-view diagram of a wire bond connection and probe contact pad.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

FIG. 1 is a top view schematic diagram of a pad 10 that includes a wire bond region 12 where a wire bond 16 is formed and a probe pad region 14 where a test probe will contact the pad 10 and leave a probe mark 18. The probe mark 18 is a damaged area of the pad 10 that results from the physical contact of the test probe. The damaged nature of the probe mark 18 would not form a good wire bond connection.

Figure 2:
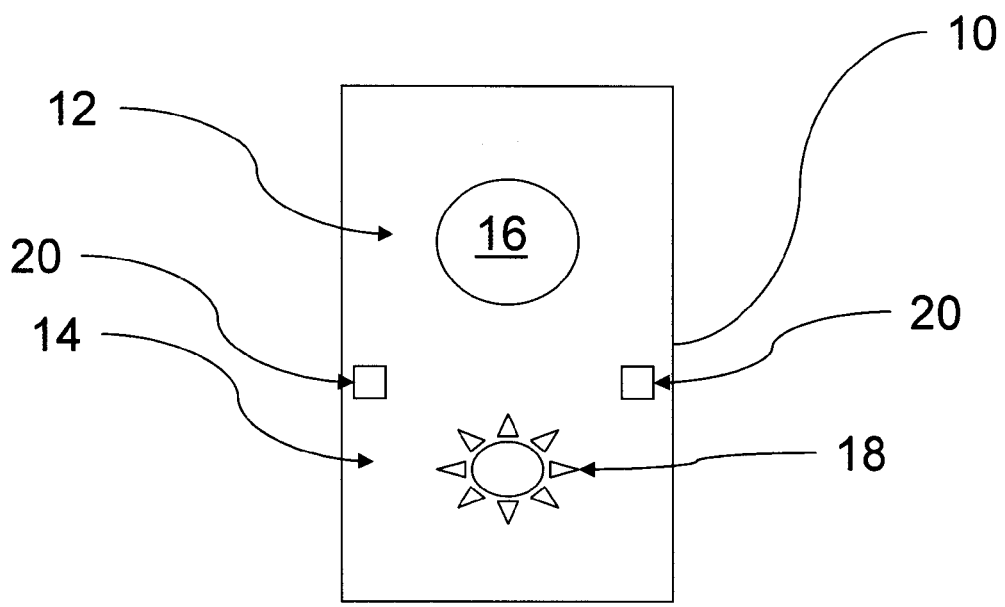
FIG. 2 is a schematic top-view diagram of a wire bond connection and probe contact pad.

Therefore, before the wire bond 16 is formed on the pad 10, a visual inspection is typically performed by operators after the probe has contacted the pad 10 and the mark 18 has been formed on the pad. A subjective decision is then made as to whether the probe mark 18 is far enough from the wirebond region 12 so that the damage of the probe mark 18 will not affect the integrity of the wirebond 16. In order to ensure that the mark 18 left by the probe is not too far into the wirebond region 12, as shown in FIG. 2, the invention creates inspection marks 20 using three-dimensional topography. The inspection marks make it easier to evaluate whether the probe mark 18 is outside the area that will be used for the wirebond 16. Therefore, the inspection marks 20 delineate the where the probe pad region 14 stops and where the wirebond region 12 begins. While two marks are shown in FIG. 2, one ordinarily skilled in the art would understand that one mark or more than two marks could be used within the scope of the invention. Further, while one wirebond connection 16 and one probe mark 18 are shown between the two marks 20, one ordinarily skilled in the art would also understand that a single mark could be used to distinguish multiple wirebond regions 12 from multiple probe pad regions 14.

The inspection marks 20 comprise a conductor filled opening in an underlying insulator. The conductive contact that electrically connects a conductor wire in the underlying wiring layer to the pad (discussed in detail below) comprises the same conductive material as the inspection mark 20. Because the inspection mark 20 is formed of the same metal used for the underlying contact 72, the probe mark 20 is not affected by the final passivation process. Therefore, the invention can be easily used with passivation materials which are not readily patterned into marks, such as polyimide materials.

Figure 3:
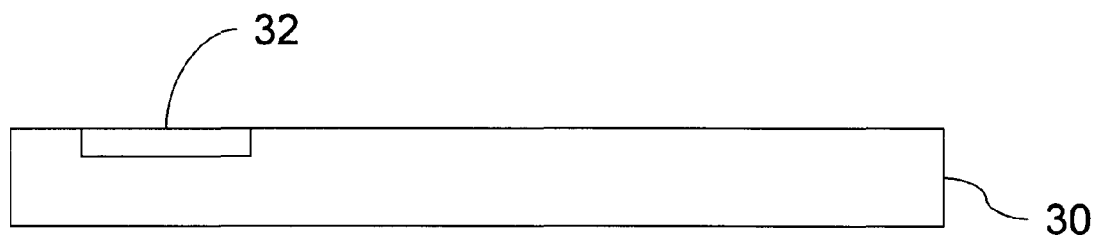
FIG. 3 is a schematic cross-sectional-view diagram of a partially completed wire bond connection and probe contact pad.

FIGS. 3-12 illustrate one exemplary method of creating one or more inspection marks for one or more probe contacts adjacent to one or more wirebond connections. This method is only an example, and those ordinarily skilled in the art would understand that other similar methods and derivations thereof could be used with equal effectiveness. FIG. 3 illustrates a small portion of a wiring layer comprising an insulating region 30 and a conductive wire 32. While one wire 32 is illustrated, one ordinarily skilled in the art would understand that the wiring layer 30 would actually contain many wires.

Figure 4:
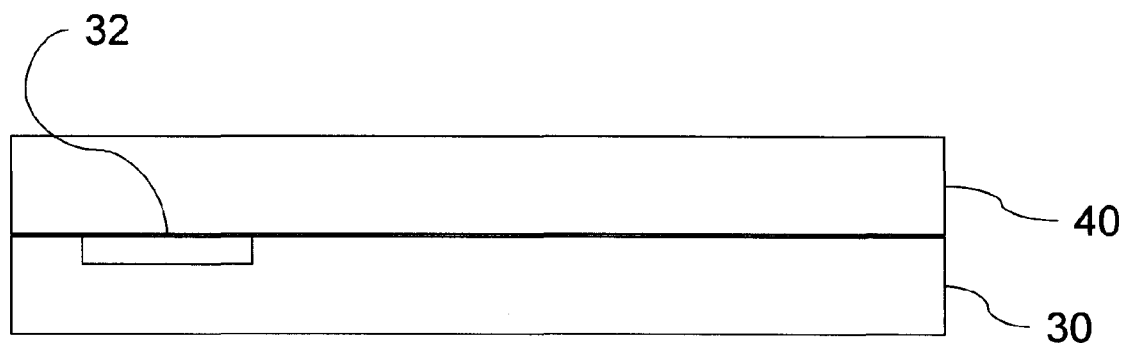
FIG. 4 is a schematic cross-sectional-view diagram of a partially completed wire bond connection and probe contact pad.
Figure 5:
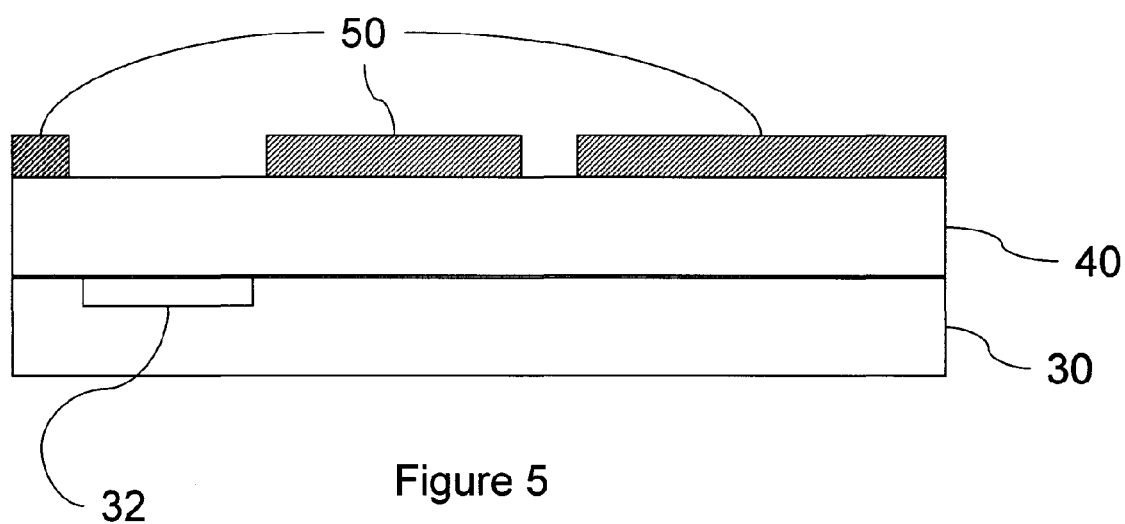
FIG. 5 is a schematic cross-sectional-view diagram of a partially completed wire bond connection and probe contact pad.

As shown in FIG. 4, an insulator layer 40 is formed over the wiring layer 30. The insulator layer 40 can comprise, for example, a deposited oxide or any other suitable insulator. A mask 50 (shown in FIG. 5) is then patterned over the insulator layer 40 using any conventional mask patterning techniques, such as exposing an organic photoresist, developing the resist, and rinsing the exposed or unexposed portions of the mask to leave the patterned mask. Many other types of masks are well known and could be used with the invention.

Figure 6:
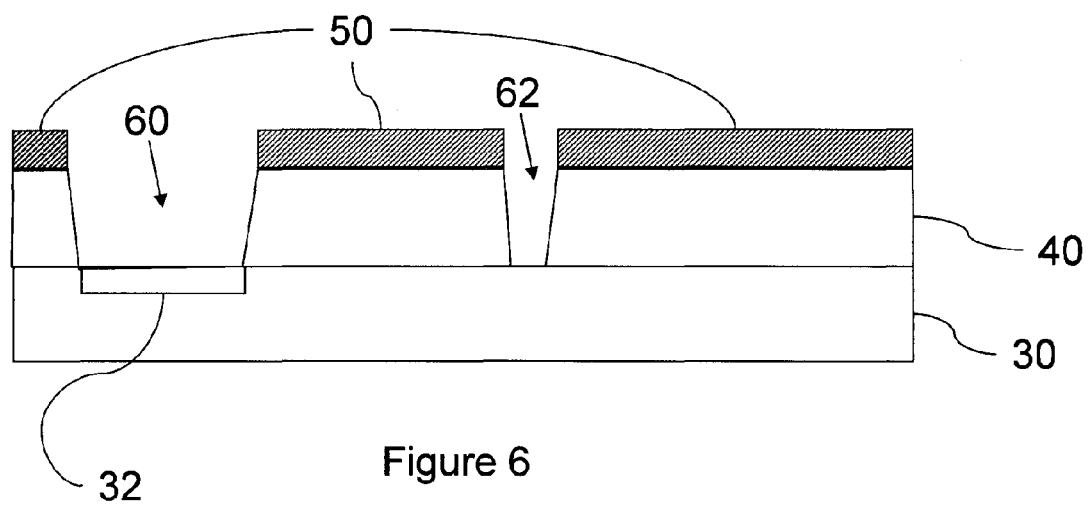
FIG. 6 is a schematic cross-sectional-view diagram of a partially completed wire bond connection and probe contact pad.

The method then simultaneously patterns a wiring contact opening 60 and an inspection mark opening 62 in the insulator layer 40, as shown in FIG. 6. The material removal process shown in FIG. 6 could comprise any conventional material removal process including etching and chemical treatment. The material removal process is preferably selective to the insulating material 40 such that the process removes the portions of the insulator layer 40 that are not protected by the mask without substantially affecting the mask 50 or the underlying conductor 32 or insulator 30.

Figure 7:
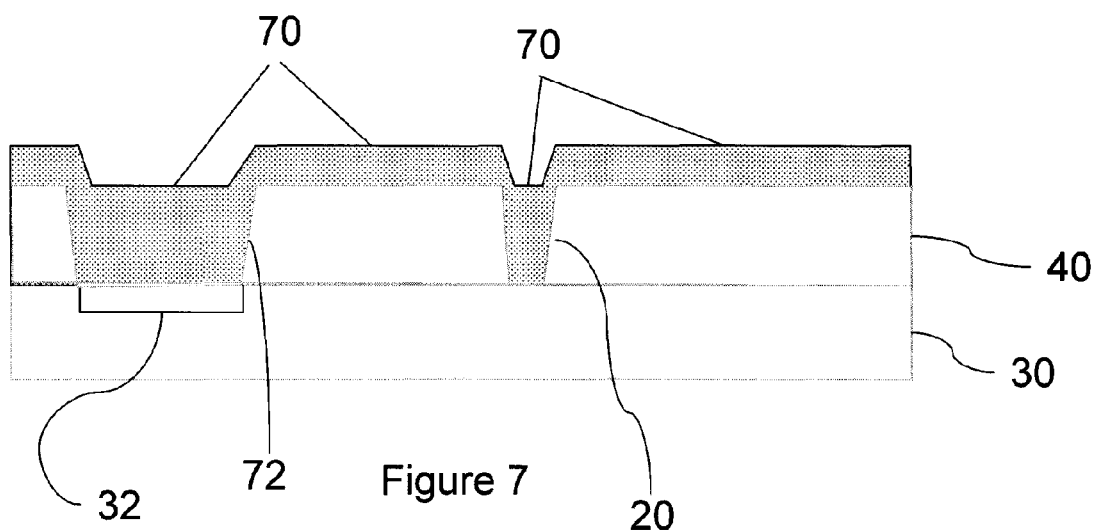
FIG. 7 is a schematic cross-sectional-view diagram of a partially completed wire bond connection and probe contact pad.

As shown in FIG. 7, the mask 50 is removed using a selective rinsing process that does not substantially affect the other components, but easily rinses the mask material 50 from the structure. Following this, a conductor 70 is deposited over the structure. The conductor 70 comprises any useful conductor, such as a refractory metal, including aluminum, tantalum, titanium, and alloys thereof that will conformally adhere to the insulator 40. As shown in FIG. 7, the conductor 70 forms a contact 72 to the underlying wiring conductor 32 and also forms the probe pad inspection mark 20. Thus, the inspection mark 20 can be considered a valley or recess in the pad 10. The inspection mark 20 is a 3-dimensional feature where the otherwise planar topography of the pad 10 is changed in a way that is visible to the outside. The opening 62 that is filled with the conductor 70 creates this 3-dimensional feature and forms the inspection mark 20.

In addition, the portions of the conductor 70 that remain on the upper surface of the insulator layer 40 comprise the pad 10 which will have the probe pad region 14 and the wirebond region 12. Since the probe pad inspection mark 20 is made of the same material 70 as the contact 72, the probe pad inspection mark 20 will survive all subsequent processing that the contact 72 survives. Therefore, for example, if polyimide processing is subsequently performed, the probe pad inspection mark 20 will survive such processing and remain as a visible inspection aid.

Figure 8:
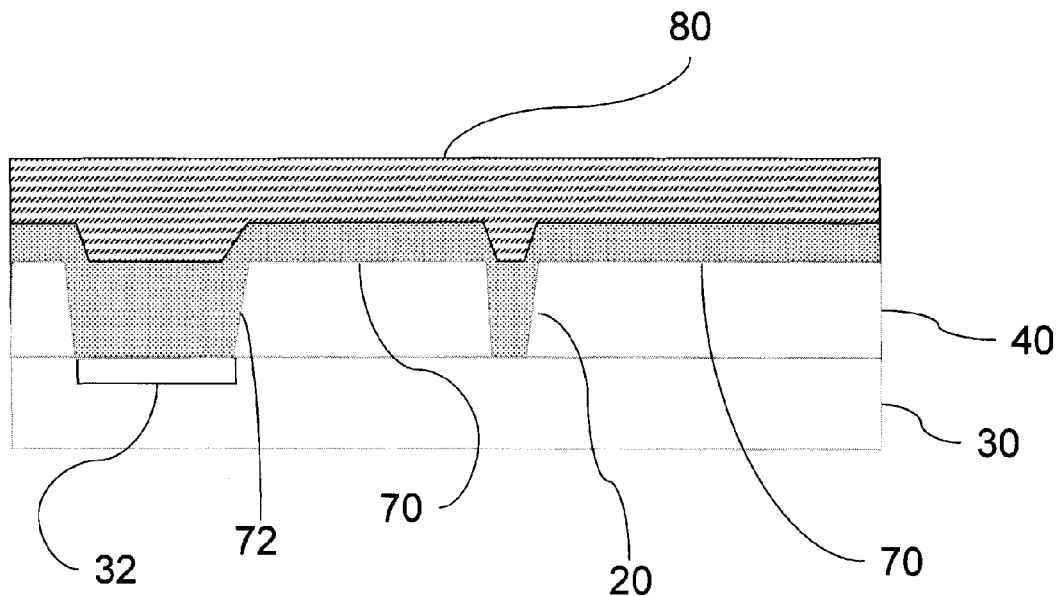
FIG. 8 is a schematic cross-sectional-view diagram of a partially completed wire bond connection and probe contact pad.
Figure 9:
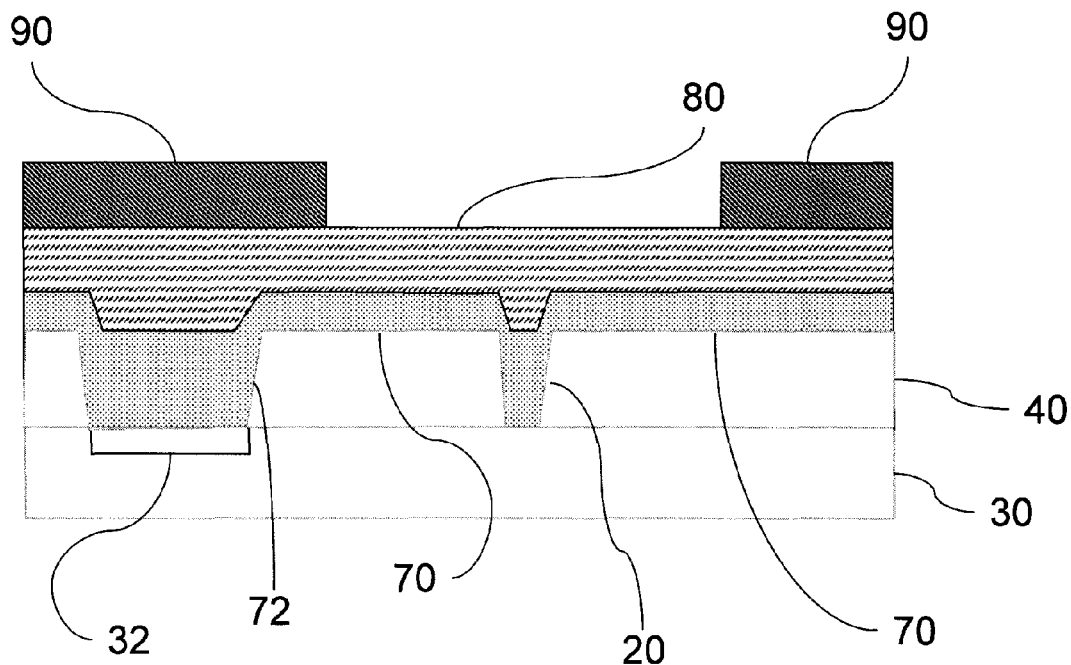
FIG. 9 is a schematic cross-sectional-view diagram of a partially completed wire bond connection and probe contact pad.
Figure 10:
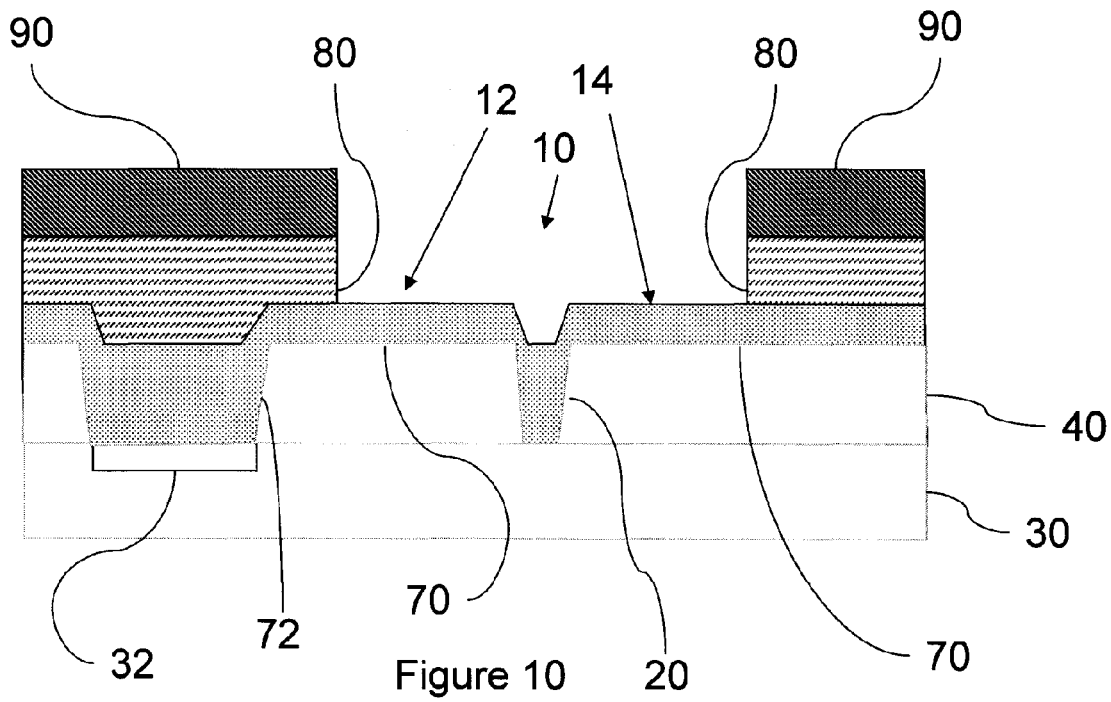
FIG. 10 is a schematic cross-sectional-view diagram of a partially completed wire bond connection and probe contact pad.

In FIG. 8, a passivation layer 80, such as polyimide, etc. is deposited over the structure. Next a mask 90, shown in FIG. 9, that is similar to mask 50 discussed above, is formed over the passivation layer 80. As shown in FIG. 10, the passivation layer 80 is patterned through the mask 90 to form an opening in the passivation layer 80 using similar material removal process techniques to those discussed above. The opening exposes the wirebond region 12 and the probe pad region 14 of the pad 10.

Figure 11:
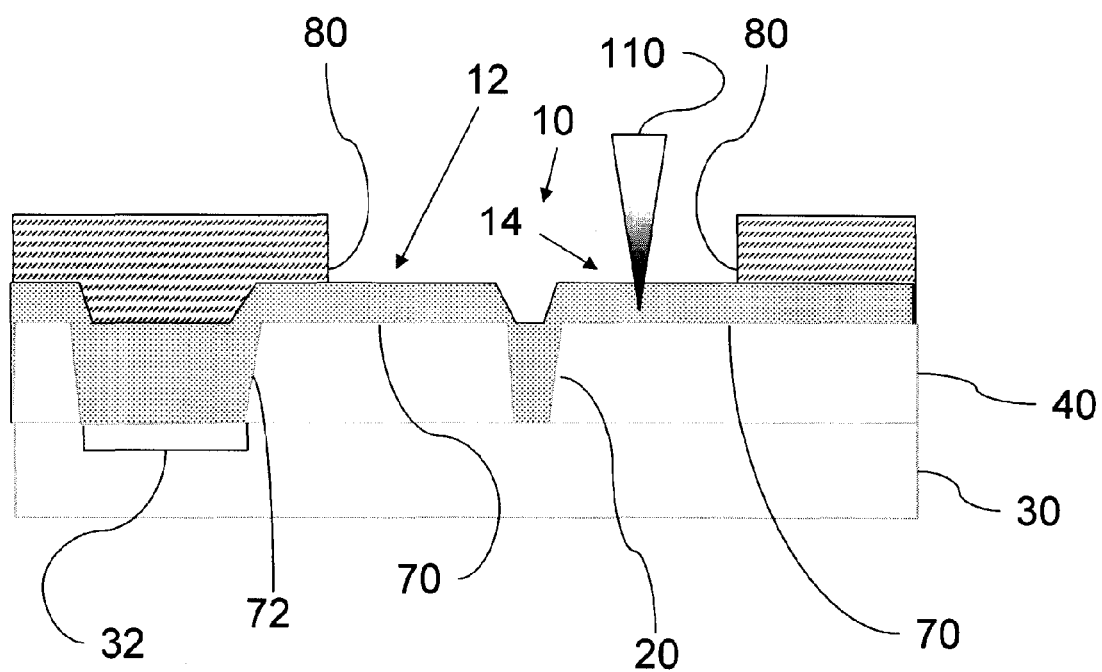
FIG. 11 is a schematic cross-sectional-view diagram of a partially completed wire bond connection and probe contact pad.
Figure 12:
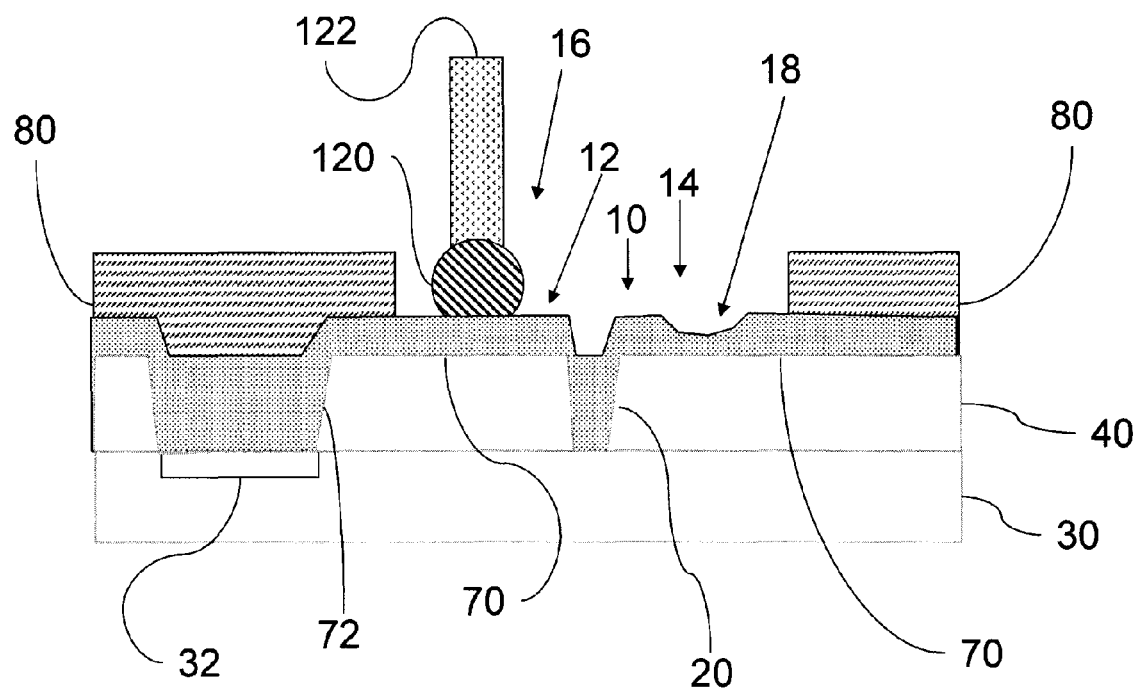
FIG. 12 is a schematic cross-sectional-view diagram of a partially completed wire bond connection and probe contact pad.

The mask 90 is then removed, as shown in FIG. 11, again using processing discussed above. FIG. 11 illustrates a probe 110, such as a test probe that could make temporary contact with the pad 10. The probe 110 preferably contacts the pad 10 in the probe pad region 14. As shown in FIG. 12, once the probe 110 is removed, a damaged area 18 that is the probe mark 18 may remain. As mentioned above, the irregular contours and the potential contamination caused in the probe mark 18 by the probe 110 makes the probe mark 18 an undesirable region in which to form the wirebond 16. Therefore, the wirebond 16 is formed by depositing or forming a solder ball 120 and connecting a wire 122 to the solder ball. Both structures 120, 122 are formed using well-known wirebonding techniques, such as convention tape transfer or similar techniques, leaving the structure shown in FIGS. 12.

The structure shown in FIG. 12 comprises an integrated circuit structure that has a wiring layer 30 below the insulator layer 40. The pad 10 comprises the conductive material 70 that is on the insulator layer 40. The pad 10 has a wirebond connection region 12 and a probe pad region 14. The inspection mark 20 is between the wirebond connection region 12 and the probe pad region 14. The inspection mark 20 comprises an opening in the insulator layer 42 that is filled with the conductive material 70. In addition, the contact 72 that is through the insulator layer 40 and is adapted to electrically connect the conductor wire 32 in the wiring layer 30 to the pad 10 and the contact 42, is also formed of the same conductive material 70 used for the pad 10 and the inspection mark 20.

Figure 13:
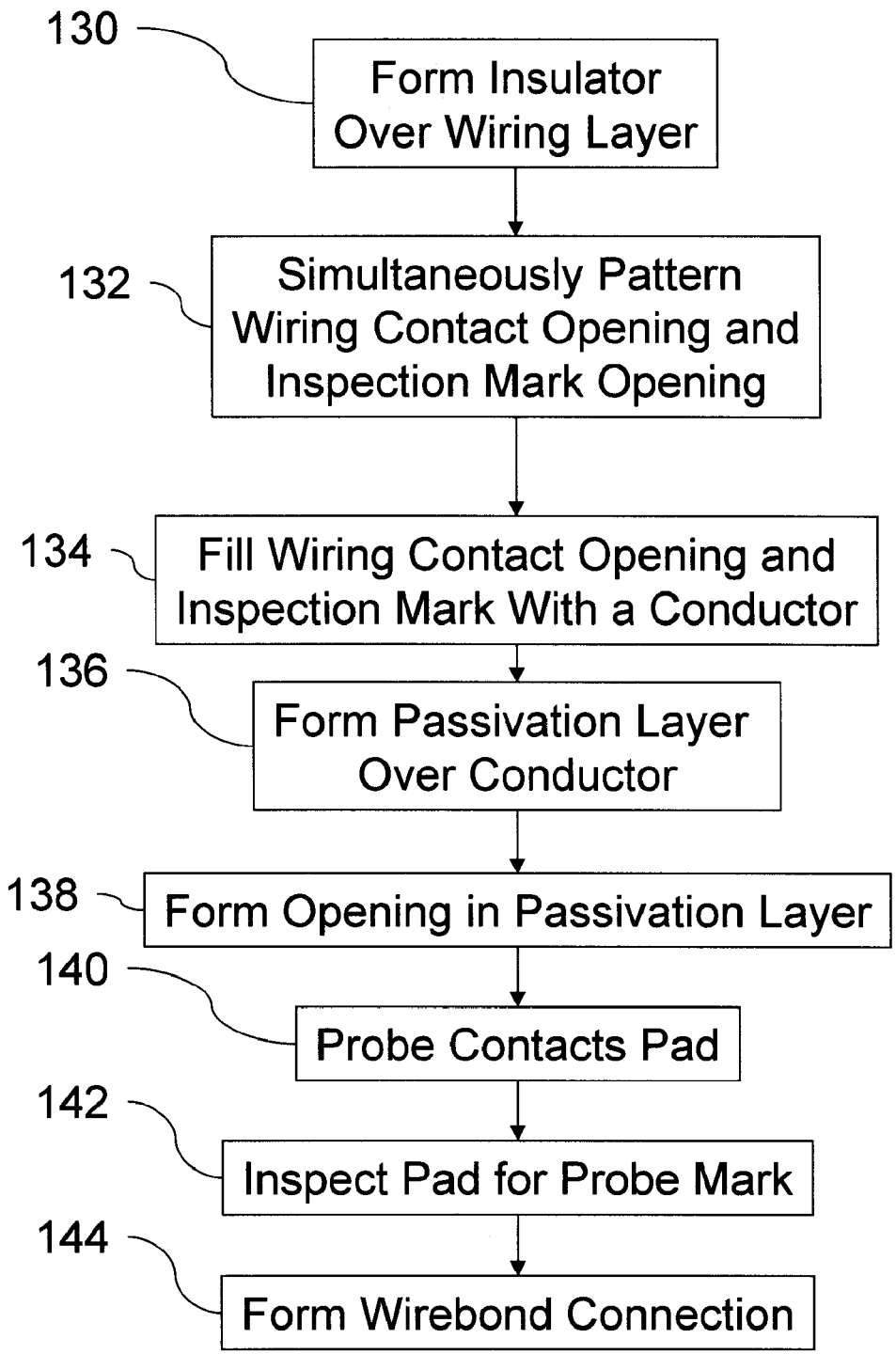
FIG. 13 is a flow diagram illustrating a preferred method of the invention.

FIG. 13 illustrates the above processing in flowchart form. More specifically, in item 130, the invention forms the insulator layer over the wiring layer and then, in item 132 the invention simultaneously patterns a wiring contact opening and an inspection mark opening in the insulator layer. The method then deposits a conductor material over the insulator layer in item 134. The conductor material fills the wiring contact opening and the inspection mark opening and forms the pad on the insulator layer. The conductor material within the inspection mark opening forms the inspection mark that is between the wirebond connection region and the probe pad region. Following this, the invention forms a passivation layer above the conductive material (136) and forms a second opening in the passivation layer in item 138. The pad is exposed through this second opening. After this, the probe contacts the pad in item 140 and the pad is inspected to determine if the damage left by the probe mark is outside the area reserved for the wirebond connection in item 142. After this, the wirebond connection is formed in item 144.

Thus, the invention creates "inspection regions" 20 by creating a 3-dimensional topography that is visible through the probe pad 122. One advantage of this invention is that it can be implemented and inspected independently of the final passivation process. Therefore, the invention can be used with polyimide and other materials. Because the inspection mark 20 is formed of the same metal used for the underlying contact 32 and pad 10, the inspection mark 20 is not affected by the final passivation process. Therefore, the invention can be easily used with passivation materials which are not readily patterned into marks, such as polyimide materials.

The creation of inspection regions allows for the reduction of overall wirebond/probe pad size. This is accomplished by the removal of tolerance associated with the inspection process when there is no identifying wirebond region to probe region delimiter.

The foregoing description of the specific embodiments reveals the general nature of the invention such that others can, by applying current knowledge, readily modify and/or adapt for various applications of such specific embodiments without departing from the generic concept. Therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. An integrated circuit structure including a portion of a conductive layer, said portion of a conductive layer comprising:
    a wire bond region;
    a probe pad region in which a probe mark is located, said probe mark including a visible area of damage; and
    an inspection mark including a contour structure that is topographically visible for inspection and that marks a boundary between said wire bond region and said probe pad region.

2. The integrated circuit structure in claim 1, all the limitations of which are incorporated herein by reference, further comprising a passivation layer above said portion of a conductive layer, said passivation layer including an opening though which said portion of a conductive layer is visible for inspection.

3. The integrated circuit structure in claim 1, all the limitations of which are incorporated herein by reference, further comprising an insulating layer underlying said portion of a conductive layer,
    wherein an inspection mark opening is formed in said insulating layer, and
    wherein said contour structure of said portion of a conductive layer overlies said inspection mark opening.

4. The integrated circuit structure in claim 1, all the limitations of which are incorporated herein by reference, wherein said portion of a conductor layer comprises a refractory metal.

5. The integrated circuit structure in claim 1, all the limitations of which are incorporated herein by reference, wherein said portion of a conductor layer comprises of aluminum, tantalum, and titanium.

6. The integrated circuit structure of claim 1, all the limitations of which are incorporated herein by reference, further comprising a connecting wire bonded to said wire bond region via a solder ball.

7. An integrated circuit structure comprising:
    a wiring layer including a conductor wire;
    an insulator layer, including an inspection mark opening, on said wiring layer;
    a conductive layer on said insulator layer, wherein said conductive layer includes a topographical contour that overlies said inspection mark opening; and
    a passivation layer on said conductive layer, said passivation layer including an opening through which a portion of said conductive layer including said topographical contour that overlies said inspection mark opening is visible for inspection,
        wherein said topographical contour delineates said portion of said conductive layer visible for inspection into a wire bond region and a probe pad region, and
        wherein said probe pad region includes a visible area of damage.

8. The integrated circuit structure in claim 7, all the limitations of which are incorporated herein by reference, wherein said inspection mark opening is formed above an insulating region of said wiring layer.

9. The integrated circuit structure in claim 7, all the limitations of which are incorporated herein by reference, wherein said conductor comprises a refractory metal.

10. The integrated circuit structure in claim 7, all the limitations of which are incorporated herein by reference, wherein said conductor comprises any of aluminum, tantalum, and titanium.

11. The integrated circuit structure in claim 7, all the limitations of which are incorporated herein by reference, further comprising an insulating layer underlying said portion of a conductive layer, wherein an inspection mark opening is formed in said insulating layer, and wherein said contour structure of said portion of a conductive layer overlies said inspection mark opening.

12. The integrated circuit structure of claim 7, all the limitations of which are incorporated herein by reference, further comprising a connecting wire is bonded to said wire bond region via a solder ball.

13. An integrated circuit structure comprising:

a wiring layer below said insulator layer said wiring layer comprising including a conductor wire;

an insulator layer, including a wiring contact opening and an inspection mark opening, on said wiring layer;

a conductive layer on said insulator layer, wherein said conductive layer includes a first topographical contour that overlies said wiring contact opening and a second topographical contour that overlies said inspection mark opening; and a passivation layer on said conductive layer, said passivation layer including an opening through which a portion of said conductive layer including said second topographical contour that overlies said inspection mark opening is visible for inspection, wherein said second topographical contour delineates said portion of said conductive layer visible for inspection into a wire bond region and a probe pad region, and wherein said probe pad region includes a visible area of damage.

14. The integrated circuit structure in claim 13, all the limitations of which are incorporated herein by reference, wherein said inspection mark opening is formed above an insulating region of said wiring layer.

15. The integrated circuit structure in claim 13, all the limitations of which are incorporated herein by reference, wherein said conductor comprises a refractory metal.

16. The integrated circuit structure in claim 13, all the limitations of which are incorporated herein by reference, wherein said conductor comprises any of aluminum, tantalum, and titanium.

17. The integrated circuit structure in claim 13, all the limitations of which are incorporated herein by reference, further comprising an insulating layer underlying said portion of a conductive layer, wherein an inspection mark opening is formed in said insulating layer, and wherein said contour structure of said portion of a conductive layer overlies said inspection mark opening.

18. The integrated circuit structure of claim 13, all the limitations of which are incorporated herein by reference, further a connecting wire is bonded to said wire bond region via a solder ball.

* * * * *